United States Patent [19]

Seok

[11] Patent Number: 5,731,627

[45] Date of Patent: Mar. 24, 1998

[54] POWER SEMICONDUCTOR DEVICES HAVING OVERLAPPING FLOATING FIELD PLATES FOR IMPROVING BREAKDOWN VOLTAGE CAPABILITY

[75] Inventor: Kyung-Wook Seok, Seoul, Rep. of Korea

[73] Assignee: Samsung Electronics Co., Ltd., Suwon, Rep. of Korea

[21] Appl. No.: 806,813

[22] Filed: Feb. 26, 1997

[30] Foreign Application Priority Data

Feb. 29, 1996 [KR] Rep. of Korea ............... 96-5356

[51] Int. Cl.$^6$ ................................................ H01L 23/58
[52] U.S. Cl. ........................................ 257/630; 257/638
[58] Field of Search .................................. 257/630, 638, 257/315, 448, 452

[56] References Cited

U.S. PATENT DOCUMENTS

| | | |
|---|---|---|
| 3,302,076 | 1/1967 | Kang et al. |
| 4,288,806 | 9/1981 | Ronen ........................... 357/45 |
| 4,399,449 | 8/1983 | Herman et al. ................ 357/53 |
| 4,801,995 | 1/1989 | Iwanishi . |
| 4,816,882 | 3/1989 | Blanchard et al. ............. 357/23.4 |
| 5,003,372 | 3/1991 | Kim et al. ...................... 357/53 |
| 5,065,201 | 11/1991 | Yamauchi . |
| 5,075,739 | 12/1991 | Davies ........................... 357/13 |
| 5,311,052 | 5/1994 | Stengl et al. . |

FOREIGN PATENT DOCUMENTS

| | | |
|---|---|---|
| 3601326 | 1/1985 | Germany . |
| 56-8871 | 1/1981 | Japan . |

OTHER PUBLICATIONS

B. Jayant Baliga, Breakdown Voltage, Chapter 3, Power Semiconductor Devices, 1996, pp. 81–113.

*Primary Examiner*—Stephen Meier
*Attorney, Agent, or Firm*—Myers, Bigel, Sibley & Sajovec

[57] ABSTRACT

Power semiconductor devices having overlapping floating field plates include a primary field plate and a plurality of floating field plates which are formed on an electrically insulating region and capacitively coupled together in series between an active region of a power semiconductor device and a floating field ring. Preferably, the capacitive coupling is achieved by overlapping at least portions of the floating field plates. According to one embodiment, a power semiconductor device comprises a semiconductor substrate having a first region of first conductivity type therein extending to a face thereof and a second region of second conductivity type in the first region of first conductivity type and forming a P-N junction therewith. To improve the breakdown characteristics of the P-N junction, an electrically insulating region is provided on the face and a primary field plate is formed on an upper surface of the electrically insulating region and in contact with the second region of second conductivity type. In addition, a first dielectric region (e.g., $SiO_2$) is provided on an upper surface of the electrically insulating region and on an upper surface of the primary field plate. A first floating field plate is formed on an upper surface of the electrically insulating region and on an upper surface of the first dielectric region extending opposite and overlapping the primary field plate. A second dielectric region is provided on the upper surface of the electrically insulating region and on an upper surface of the first floating field plate. A second floating field plate is also provided on the upper surface of the electrically insulating region and on an upper surface of the second dielectric region extending opposite and overlapping the first floating field plate.

12 Claims, 6 Drawing Sheets

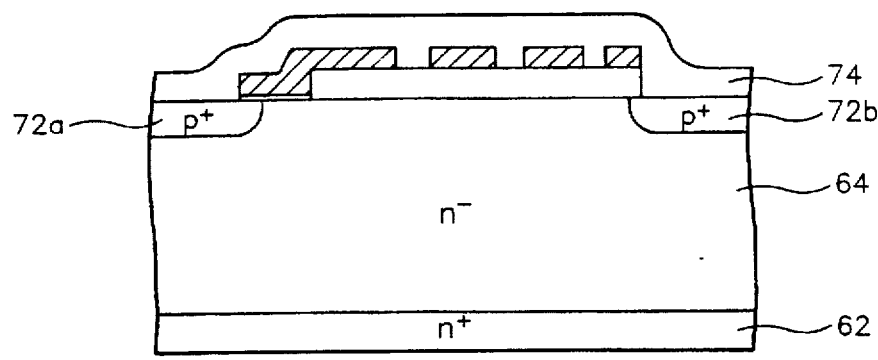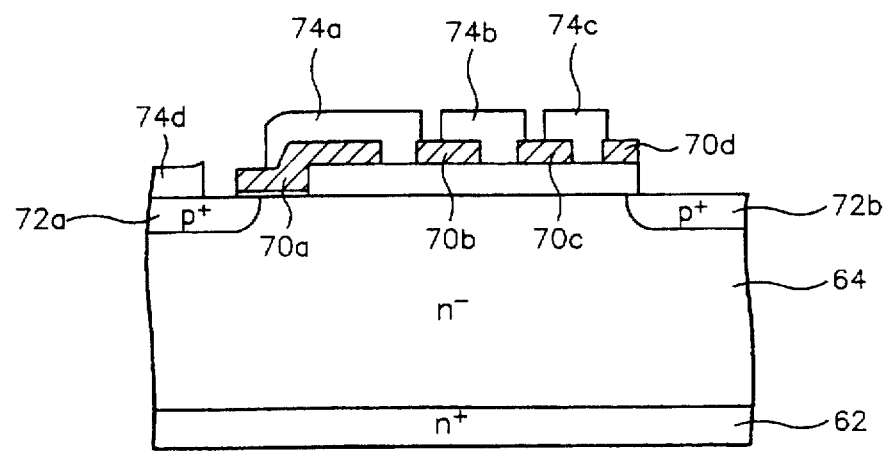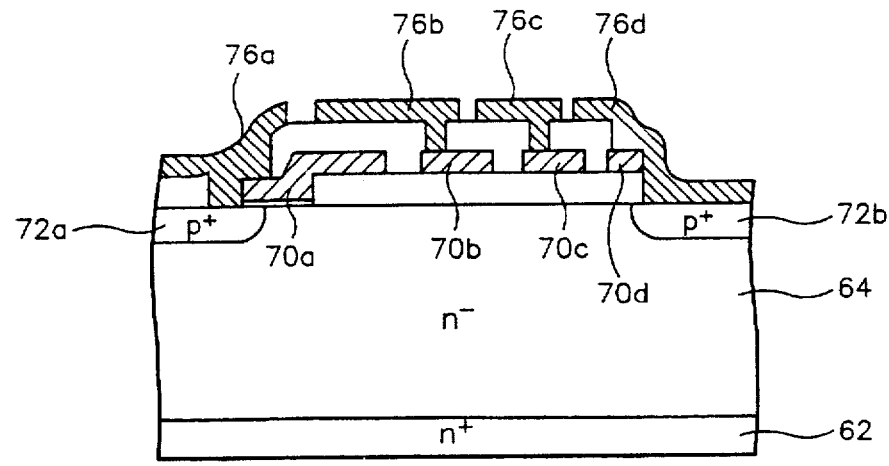

POWER SEMICONDUCTOR DEVICES HAVING OVERLAPPING FLOATING FIELD PLATES FOR IMPROVING BREAKDOWN VOLTAGE CAPABILITY

FIELD OF THE INVENTION

The present invention relates to semiconductor devices and fabrication methods, and more particularly to power semiconductor devices and methods of fabricating same.

BACKGROUND OF THE INVENTION

The breakdown characteristics of parallel-plane (semi-infinite) junctions typically provide an upper bound on the breakdown characteristics of power semiconductor devices. This is because the breakdown voltages of practical power devices having finite length P-N junctions are typically limited by the occurrence of high electric fields either within interior portions of the devices or at the edges of the devices.

Although many specific edge termination techniques have been proposed in the literature to improve breakdown voltage, these techniques can generally be classified into two basic types, namely, planar terminations based upon masked diffusion processes and beveled terminations based upon the selective removal of material from the vicinity of the edge junctions. In both these techniques, floating field plates and floating field rings have been found to be useful in enhancing the breakdown voltage of power semiconductor devices. Such conventional techniques are more fully described in Section 3.6 of a textbook by B. J. Baliga entitled *Power Semiconductor Devices*, PWS Publishing Co. (1995), pp. 81–113.

Typical power semiconductor devices include the insulated gate bipolar transistor (IGBT) and static-induction transistor (SIT). FIG. 1 illustrates a schematic cross-sectional view of a conventional insulated gate bipolar transistor containing an N+ buffer region 13 on a P+ substrate 12 having an anode electrode 11 on a face thereof. An N− drift region 14 is also provided on the buffer region 13. Adjacent P-type base regions 15 are also provided in the drift region 14 by implanting and then diffusing P-type dopants into an upper surface of the drift region 14 using an insulated gate electrode, comprising an insulating layer 18 and gate electrode 19, as an implant mask. N-type source regions 16 are also provided in the P-type base regions 15. Contact to the base and source regions is provided by a cathode contact 17 on the upper surface of the drift region 14. As will be understood by those skilled in the art, the P-type substrate 12, the N-type buffer and drift regions 13–14, and P-type base region 15 collectively form the emitter, base and collector of a vertical P-N-P bipolar transistor having a floating base. In order to turn the vertical P-N-P bipolar transistor on, the anode electrode 11 is biased positive relative to the cathode electrode 17 and a positive bias is applied to the gate electrode 19. The application of a positive bias to the gate electrode 19 causes the formation of inversion-layer channels in the base regions 15. These inversion-layer channels electrically connect the source regions 16 to the drift region 14 and provide the base drive current needed to initiate turn-on of the P-N-P transistor.

FIG. 2 illustrates a schematic cross-sectional view of a static induction transistor comprising a drain electrode 21, P+ substrate region 22, N+ buffer region 23, N− drift region 24, P+ gate regions 25, N+ source region 26 and source electrode 27. The source electrode 27 may be electrically isolated from the gate regions 25 by an electrically insulating region 28. As will be understood by those skilled in the art, forward conduction can be controlled by controlling the magnitude of the reverse bias appearing across the P-N junctions formed between the gate regions 25 drift region 24. When this reverse bias is substantial, the depletion regions formed in the drift region 24 merge to pinch-off the conductive channel formed in the space between the gate regions 25 and thereby prevent forward conduction. Thus, the resistance of the channel region can be modulated by the magnitude of the reverse bias appearing across the gate region/drift region junctions.

Unfortunately, both of the above described power semiconductor devices are susceptible to premature breakdown because the base regions 15 of FIG. 1 and gate regions 25 of FIG. 2 do not form semi-infinite parallel-plane P-N junctions with the drift regions 14 and 24, respectively. This premature breakdown is caused by electric field crowding at the curved edges of the base and gate regions. Moreover, the degree of field crowding is worse when the junction depths are small compared to the depletion layer thickness in the drift region.

As described above, in order to enhance the breakdown voltages of power semiconductor devices, several types of structures have been developed. Two well known structures can be made by a simplified fabrication method. One of these structures is a floating field ring 48 which is spaced apart from a main junction region 46 in a substrate region 44, as illustrated by FIG. 3. An insulating region 49 may also be provided on a face of the substrate. The other of these structures is a field plate 58 which is connected to a main junction 56 at the face of a substrate 54 and is spaced from the face by an electrically insulating region 59, as illustrated by FIG. 4. Referring again to FIG. 3, a depletion layer 45 indicated by a dotted line may be generated and extended from the main junction region 46 to an outer edge of the floating field ring 48 when the main junction region is reverse biased. This prevents electric field crowding in the region "$W_s$" which designates the spacing between the main junction region 46 and the floating field ring 48. As a result, the device of FIG. 3 may be able to support a breakdown voltage in a range of about 60–80% of the ideal breakdown voltage of a parallel-plane junction. Referring again to FIG. 4, a depletion layer 55 indicated by a dotted line may be generated in the substrate 54 because of the presence of the field plate 58. As a result, the device of FIG. 4 may be able to support a breakdown voltage in a range of about 60% of the ideal breakdown voltage of a parallel-plane junction. To enhance the breakdown voltage of the structure of FIG. 4, an insulating layer 59 (e.g., $SiO_2$) may be provided, as illustrated. As will be understood by those skilled in the art, if the insulating layer 59 is thick, breakdown will typically occur in region "A", however if the insulating layer 59 is thin then breakdown will typically occur in region "B".

Notwithstanding these above described attempts to increase the breakdown voltage ratings of power semiconductor devices to the near ideal levels associated with parallel-plane junctions, there still continues to be need for structures which can improve the breakdown voltage ratings of power devices even further.

SUMMARY OF THE INVENTION

It is therefore an object of the present invention to provide improved power semiconductor devices and methods of forming same.

It is another object of the present invention to provide power semiconductor devices having high breakdown voltages and methods of forming same.

These and other objects, features and advantages of the present invention are provided by power semiconductor devices having overlapping floating field plates for improving the breakdown characteristics of active regions therein and methods of forming same. In particular, a primary field plate and a plurality of floating field plates are formed on an electrically insulating region and are capacitively coupled together in series between an active region of a power semiconductor device and a floating field ring. Preferably, the capacitive coupling is achieved by overlapping at least portions of the floating field plates. According to one embodiment of the present invention, a power semiconductor device comprises a semiconductor substrate having a first region of first conductivity type therein extending to a face of the substrate and a second region of second conductivity type in the first region of first conductivity type and forming a P-N junction therewith.

To improve the breakdown characteristics of the P-N junction, an electrically insulating region is provided on the face and a primary field plate is formed on an upper surface of the electrically insulating region and in contact with the second region of second conductivity type. In addition, a first dielectric region (e.g., $SiO_2$) is provided on an upper surface of the electrically insulating region and on an upper surface of the primary field plate. A first floating field plate is formed on an upper surface of the electrically insulating region and on an upper surface of the first dielectric region extending opposite and overlapping the primary field plate. A second dielectric region is provided on the upper surface of the electrically insulating region and on an upper surface of the first floating field plate. To improve the breakdown characteristics of the device further, a second floating field plate is provided on the upper surface of the electrically insulating region and on an upper surface of the second dielectric region extending opposite and overlapping the first floating field plate. A floating field ring of second conductivity type may also be provided in the substrate and capacitively coupled to the second floating field plate by a termination field plate connected thereto at the face of the substrate. Additional floating field plates may also be provided on the electrically insulating region depending on the degree of breakdown protection desired. The overlap between the primary, floating and termination field plates is also preferably selected so that the capacitance between the primary field plate and first floating field plate is greater (e.g., by a factor of 2) than the capacitance between the first and second floating field plates and this latter capacitance is greater (e.g., by a factor of 2) than the capacitance between the second floating field plate and the termination field plate.

Preferred methods of forming power semiconductor devices having overlapping floating field plates comprise the steps of patterning an electrically insulating region on a face of a semiconductor substrate containing a region of first conductivity type therein extending to the face and then patterning a first conductive region on an upper surface of the insulating region to define a primary field plate and a first floating field plate extension. A first dielectric region is then formed on upper surfaces of the electrically insulating region, primary field plate and first floating field plate extension. The first dielectric region is then patterned to define a via exposing the first floating field plate extension and then a second conductive region is formed on an upper surface of the patterned first dielectric region and in the via exposing the floating field plate extension. The second conductive region is preferably patterned into a first floating field plate (which extends opposite the upper surface of the primary field plate). These above steps are also preferably performed simultaneously with steps of forming a power semiconductor device in the substrate so that the device has a region of second conductivity type therein which forms a P-N junction with the region of first conductivity type and is electrically connected to the primary field plate and capacitively coupled to the first floating field plate.

BRIEF DESCRIPTION OF THE DRAWINGS

FIGS. 6A–6G illustrate schematic cross-sectional views of intermediate structures illustrating a method of forming a power semiconductor device having overlapping floating field plates according to an embodiment of the present invention.

DESCRIPTION OF PREFERRED EMBODIMENTS

Figure 1:
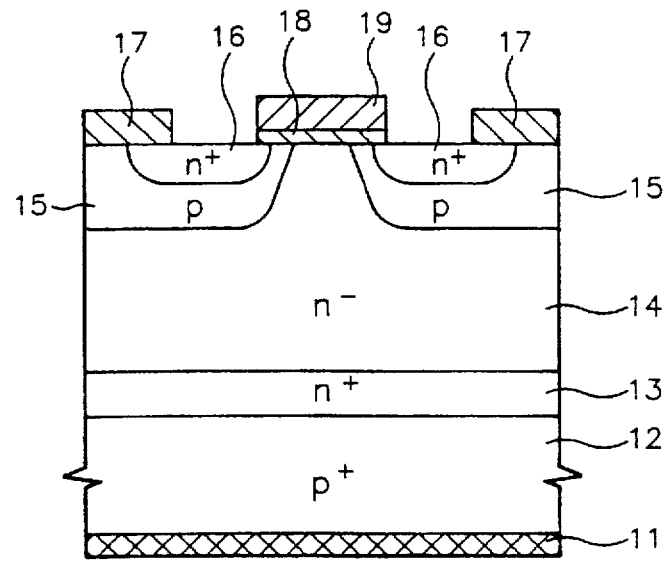
FIG. 1 illustrates a schematic cross-sectional view of an insulated-gate bipolar transistor (IGBT) according to the prior art.
Figure 2:
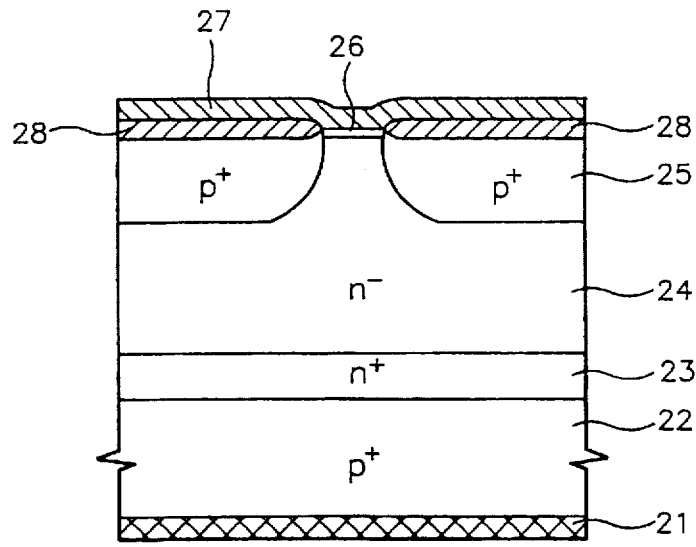
FIG. 2 illustrates a schematic cross-sectional view of a static induction transistor (SIT) according to the prior art.
Figure 3:
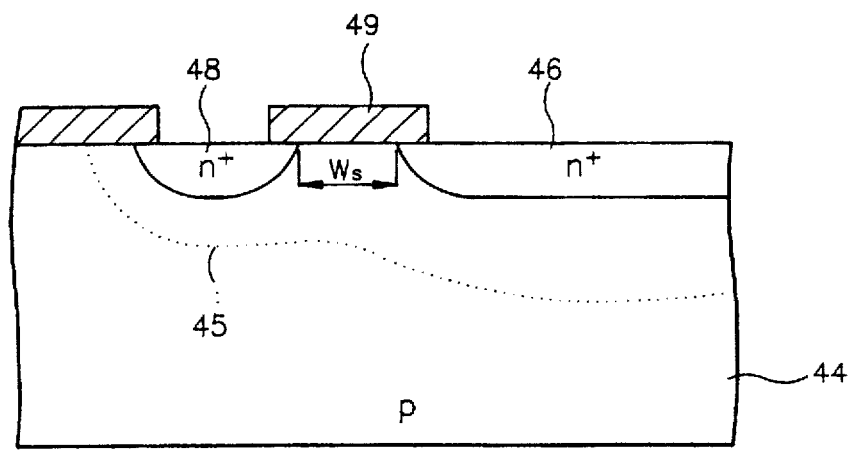
FIG. 3 illustrates a schematic cross-sectional view of a semiconductor device with floating field ring according to the prior art.
Figure 4:
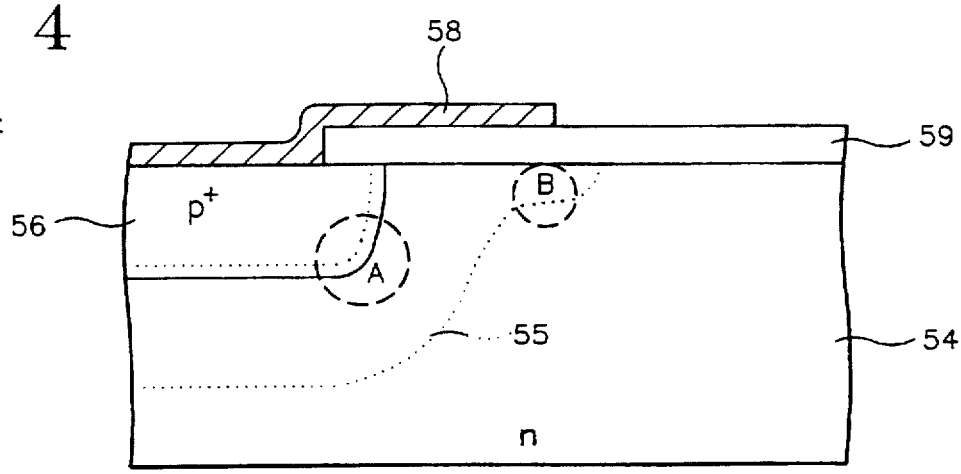
FIG. 4 illustrates a schematic cross-sectional view of a semiconductor device with floating field plate according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Figure 5A:
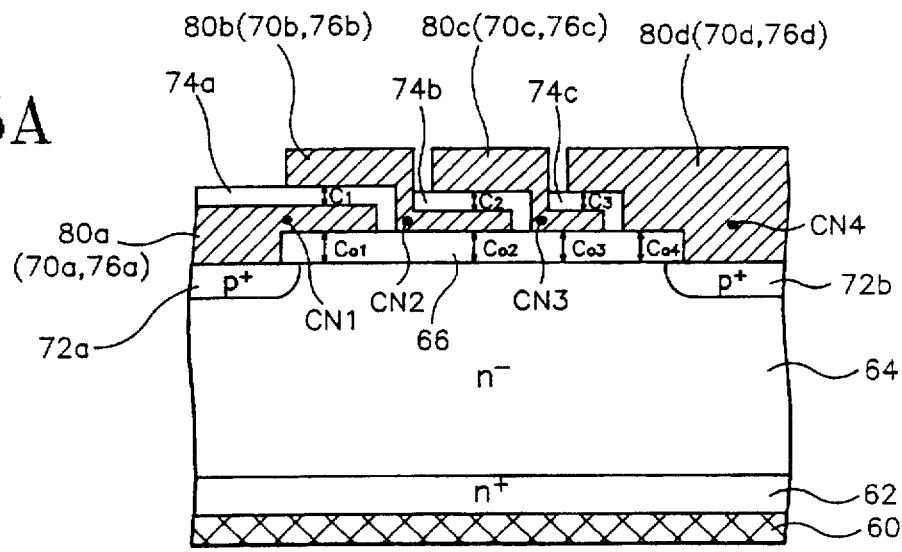
FIG. 5A illustrates a schematic cross-sectional view of a semiconductor device having overlapping floating field plates according to an embodiment of the present invention.
Figure 5B:
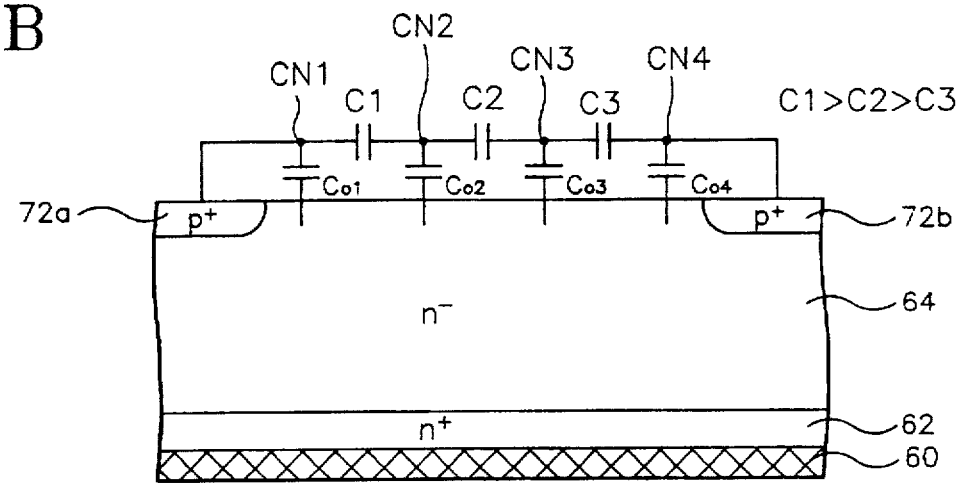
FIG. 5B illustrates an equivalent electrical schematic of the overlapping floating field plates according to the embodiment of FIG. 5A.
Figure 6A:
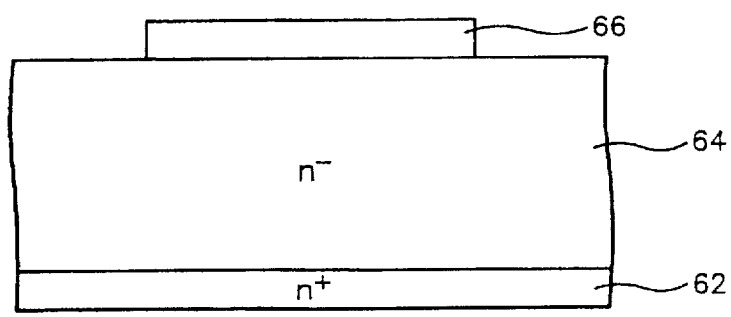
Figure 6B:
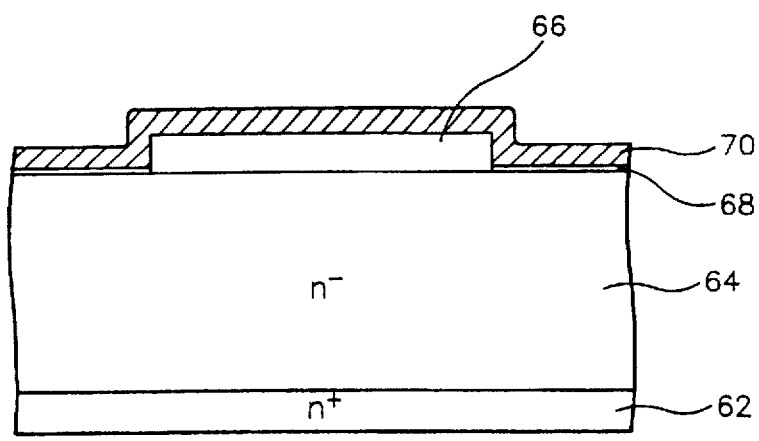

Referring now to FIGS. 5A–5B and 6A–6G, preferred methods of forming power semiconductor devices having overlapping floating field plates will now be described. In particular, an embodiment of a preferred method includes the steps of patterning an electrically insulating region 66 on a face of a semiconductor substrate containing a region of first conductivity type therein extending to the face, as illustrated best by FIG. 6A. Here, the semiconductor substrate may comprise a buffer layer 62 of first conductivity type (shown as N+) and a drift region 64 of first conductivity type (shown as N−). The electrically insulating region 66 may be formed by depositing or thermally growing a blanket layer of oxide (e.g., $SiO_2$) on the face of the substrate and then etching the blanket layer using a mask (not shown) to define the illustrated insulating region 66. Referring now to FIG. 6B, the portions of the face of the substrate which are exposed after the insulating region 66 has been patterned may then be oxidized to form a thin oxide layer 68. A blanket conductive layer 70 of polycrystalline silicon (or metal), for example, may then be deposited on upper surfaces of the thin oxide layer 68 and electrically insulating region 66.

Figure 6C:
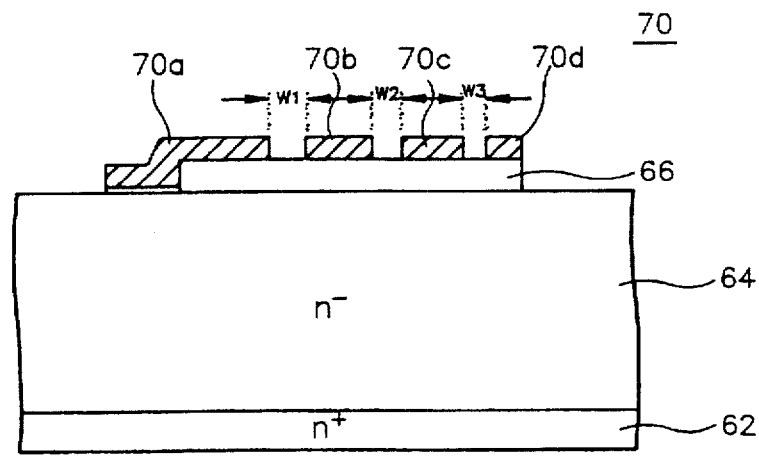
Figure 6D:
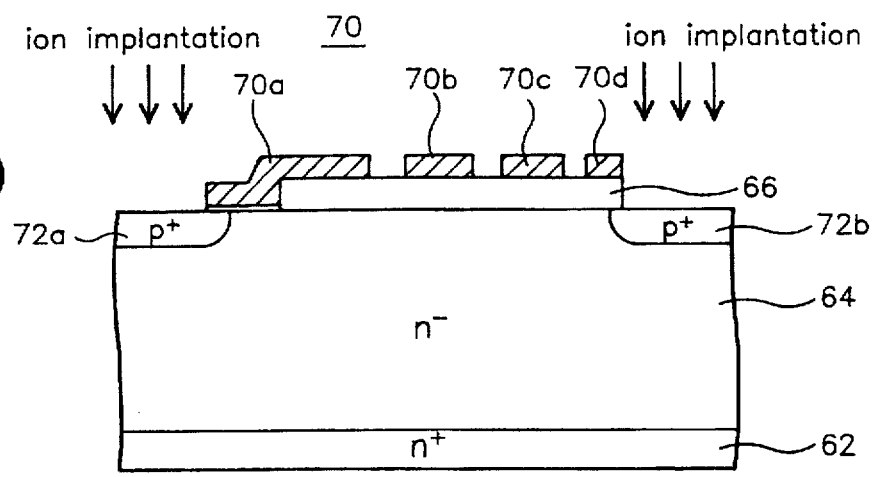

As best illustrated by FIG. 6C, the blanket conductive layer 70 is then patterned using conventional etching techniques to define a primary field plate 70a, a first floating field plate extension 70b, a second floating field plate extension 70c and a termination field plate extension 70d. As illustrated, the spacings between the field plate and field plate extensions are "W1", "W2" and "W3". During the etching step to pattern the blanket conductive layer 70, the face of the substrate may also be exposed, as illustrated. Referring now to FIG. 6D, first and second regions 72a and 72b of second conductivity type (shown as P+) may then be formed at the face in a self-aligned manner by implanting impurities of second conductivity type (e.g., boron) into the face using the insulating region 66 as a mask and then diffusing and activating the implanted impurities. A blanket layer of a dielectric material 74 (e.g., $SiO_2$ or PSG) is then deposited on the face of the substrate, upper surfaces of the primary field plate and field plate extensions 70a–d and exposed portions of the upper surface of the electrically insulating region 66, as illustrated by FIG. 6E. The blanket layer of dielectric material 74 is then patterned to define dielectric segments 74a, 74b, 74c and 74d and vias or contact holes therebetween which expose upper surfaces of the primary field plate 70a (and the face of the substrate), the first and second floating field plate extensions 70b–c and the termination field plate extension 70d, as illustrated by FIG. 6F.

Referring now to FIG. 6G, a blanket conductive layer of polycrystalline silicon (or metal), for example, is then deposited on the exposed portions of the face and on the exposed upper surfaces of the primary field plate 70a and the first, second and termination field plate extensions 70b–d. The blanket conductive layer is then patterned using conventional etching techniques to define a contact electrode 76a, a first floating field plate 76b (which includes the first floating field plate extension 70b), a second floating field plate 76c (which includes the second floating field plate extension 70c) and a termination field plate 76d (which includes the termination field plate extension 70d). As further illustrated by FIG. 6G, the contact electrode 76a preferably contacts the first region 72a of second conductivity type and the termination field plate 76d preferably contacts the second region 72b of second conductivity type. Here, the first region 72a of second conductivity type is preferably formed as an active region of a power semiconductor device which forms a P-N junction with the drift region 64. In addition, the second region 72b of second conductivity type is preferably formed as a floating field ring which is capacitively coupled in series to the primary field plate 70a by the first and second floating field plates 76b and 76c.

As described more fully hereinbelow, by capacitively coupling the floating field ring 72b to the overlapping primary and floating field plates 70a–c, the breakdown voltage of a semiconductor device, such as a power MOSFET, IGBT or SIT, for example, may be increased by improving the breakdown characteristics of the P-N junction formed between the first region of second conductivity type 72a and the drift region 64. In particular, referring again to FIGS. 5A–5B, a semiconductor device containing overlapping floating field plates according to a preferred embodiment of the present invention, is illustrated. The semiconductor device contains an active region 72a therein which forms a P-N junction with a drift region 64. A plurality of field plates and a floating field ring are also preferably provided to improve the breakdown characteristics of the P-N junction formed between the active region 72a and the drift region 64. Here, with reference to FIGS. 5A and 6G, a device terminal 80a is illustrated as comprising a contact electrode 76a and a primary field plate 70a, a first floating field plate 80b is illustrated as comprising regions 70b 76b, a second floating field plate 80c is illustrated as comprising regions 70c and 76c and a termination field plate 80d is illustrated as comprising regions 70d and 76d. Moreover, as best illustrated schematically by FIG. 5B, the primary field plate 80a, the first and second floating field plates 80b–c and the termination field plate 80d are capacitively coupled to the drift region 64, as illustrated by capacitors $C_{O1}$–$C_{O4}$, to inhibit the occurrence of high electric fields at the edges of the active region 72a. According to additional embodiments of the present invention, power semiconductor devices may also be formed having more than two floating field plates.

As will be understood by those skilled in the art, the magnitudes of $C_{O1}$–$C_{O4}$ are a function of, among other things, the thickness and dielectric constant of the electrically insulating region 66. The primary field plate 80a and first floating field plate 80b are capacitively coupled together, as illustrated by capacitor $C_1$. Here, the magnitude of $C_1$ is a function of, among other things, the thickness and dielectric constant of dielectric region 74a and the amount of overlap between the first floating field plate 80b and an upper surface of the primary field plate 80a. Similarly, the first floating field plate 80b and second floating field plate 80c are capacitively coupled together, as illustrated by capacitor $C_2$. Here, the magnitude of $C_2$ is a function of, among other things, the thickness and dielectric constant of dielectric region 74b and the amount of overlap between the second floating field plate 80c and an upper surface of the first floating field plate 80b. The second floating field plate 80c and termination field plate 80d are capacitively coupled together, as illustrated by capacitor $C_3$. Here, the magnitude of $C_3$ is a function of, among other things, the thickness and dielectric constant of dielectric region 74c and the amount of overlap between the termination field plate 80d and an upper surface of the second floating field plate 80c. According to one preferred embodiment of the present invention, the overlap between regions 80a–b, 80b–c and 80c–d is 72 µm, 32 µm and 16 µm so that the value of $C_1$ is greater than about two times the value of $C_2$ and the value of $C_2$ is greater than about two times the value of $C_1$.

In the below table, the results according to a simulation test of a power semiconductor device with the above structure are provided. It can be seen from the below table that the voltage drop depends on a change in depth of the main junction region (e.g., 5 µm or 3 µm) and the amount of interfacial charge between the oxide layer 66 and the semiconductor layer 64, when a voltage is applied to the power semiconductor device.

TABLE 1

| Interfacial Charge | Junction Depth = 5 μm | Junction Depth = 3 μm |
| --- | --- | --- |
| $1 \times 10^{11}/cm^2$ | 550V | 531V |
| $2 \times 10^{11}/cm^2$ | 549V | 529V |
| $4 \times 10^{11}/cm^2$ | 545V | 525V |

Figure 7:
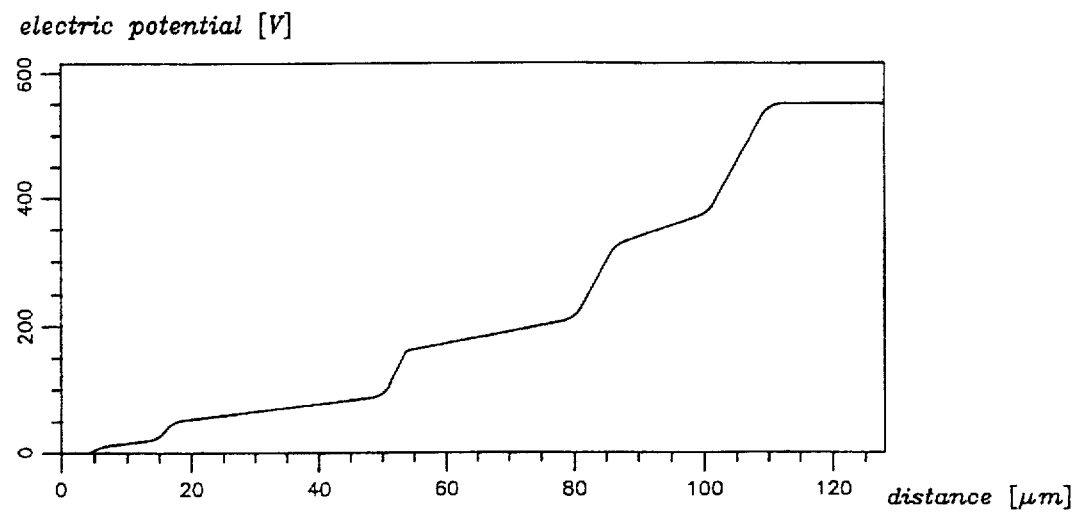
FIG. 7 is a graph diagram showing the variation of an interfacial electric potential versus the distance between a silicon layer and an oxide layer when a voltage of about 550V is applied to the power semiconductor device of FIG. 5A.
Figure 8:
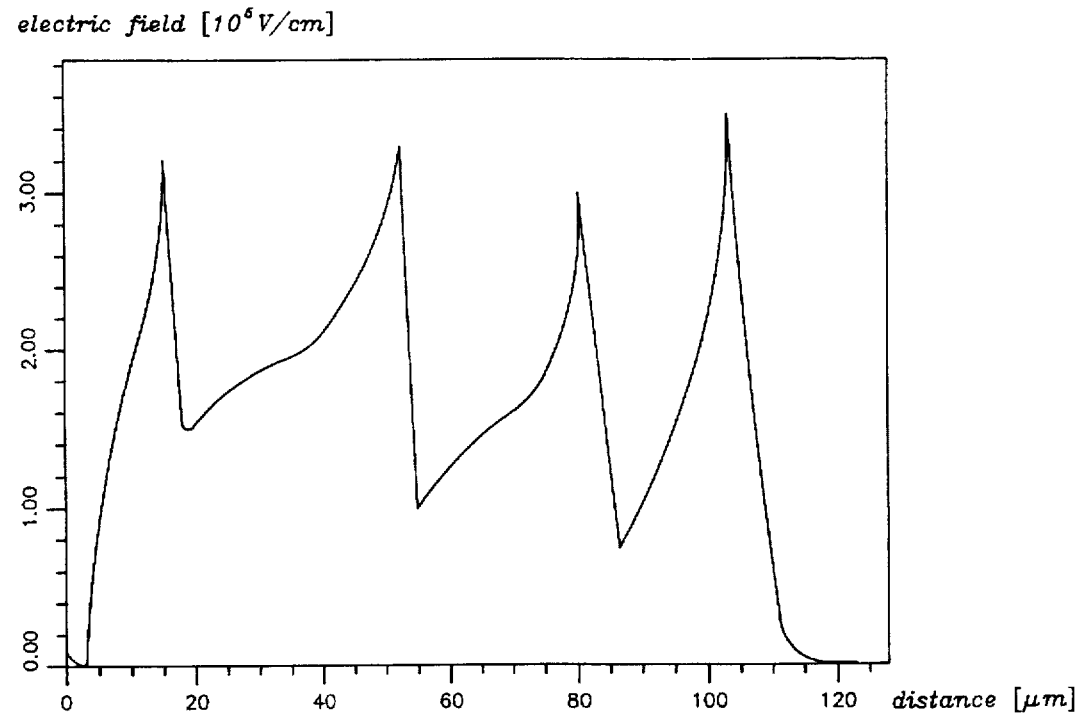
FIG. 8 is a graph diagram showing the variation of an interfacial electric field versus the distance between a silicon layer and an oxide layer when a voltage of about 550V is applied to the power semiconductor device of FIG. 5A.

FIG. 7 also illustrates the variation of an interfacial electric potential between the semiconductor layer 64 and the oxide layer 66 versus distance from the first region 72a of second conductivity type to the second region 72b of second conductivity type when a voltage of 550V is applied to the power semiconductor device of FIG. 5A. In addition, FIG. 8 illustrates the variation of an interfacial electric field between the semiconductor layer 64 and the oxide layer 66 versus distance from the first region 72a of second conductivity type to the second region 72b of second conductivity type when a voltage of 550V is applied to the power semiconductor device of FIG. 5A. Also, it can be seen from FIG. 8 that each peak value in the interfacial electric potential at several connection points CN1–CN4 (shown in FIG. 5B) is controlled to be nearly equal to each other, because the capacitors are connected in series.

As described above, power semiconductor devices of the present invention are provided with an overlapped field plate structure, in which a plurality of field plates are partially overlapped with a single insulating layer therebetween. As a result, when a voltage is applied to the device, a plurality of capacitors are charged and each is comprised of one field plate and the insulating layer. Therefore, since the applied voltage can be divided by the capacitors connected in series, the breakdown characteristics of a device can be considerably enhanced and thus a withstand voltage against the insulating layer is improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor device, comprising:
   a semiconductor substrate having a first region of first conductivity type therein extending to a surface thereof;
   a second region of second conductivity type in said first region and forming a P-N junction therewith;
   an electrically insulating region on said first region at the surface of said substrate;
   a primary field plate electrically connected to said second region and extending onto an upper surface of said electrically insulating region;
   a first dielectric region on an upper surface of said primary field plate extending opposite said electrically insulating region;
   a first floating field plate on the upper surface of said electrically insulating region and on an upper surface of said first dielectric region extending opposite said primary field plate;
   a third region of second conductivity type in said first region of first conductivity type and forming a P-N junction therewith; and
   a termination field plate electrically connected to said third region and capacitively coupled to said first floating field plate.

2. The power semiconductor device of claim 1, further comprising a second dielectric region on an upper surface of said first floating field plate extending opposite said electrically insulating region; and a second floating field plate on the upper surface of said electrically insulating region and on an upper surface of said second dielectric region extending opposite said first floating field plate.

3. The power semiconductor device of claim 2, further comprising a third dielectric region on an upper surface of said second floating field plate extending opposite said electrically insulating region; and wherein said termination field plate extends on an upper surface of said third dielectric region extending opposite said second floating field plate.

4. The power semiconductor device of claim 3, wherein a first capacitance between said first floating field plate and said primary field plate is greater than a second capacitance between said second floating field plate and said first floating field plate.

5. The power semiconductor device of claim 4, wherein the first capacitance is greater than about two times the second capacitance.

6. The power semiconductor device of claim 3, wherein a first capacitance between said first floating field plate and said primary field plate is greater than a second capacitance between said second floating field plate and said first floating field plate; and wherein the second capacitance is greater than a third capacitance between said termination field plate and said second floating field plate.

7. The power semiconductor device of claim 6, wherein the first capacitance is greater than about two times the second capacitance and the second capacitance is greater than about two times the third capacitance.

8. The power semiconductor device of claim 3, wherein said first, second and third dielectric regions extend onto the upper surface of said electrically insulating region.

9. A semiconductor device having overlapping floating field plates, comprising:
   a semiconductor substrate having a first region of first conductivity type therein extending to a surface thereof;
   a second region of second conductivity type in said first region at the surface and forming a P-N junction therewith;
   an electrically insulating region on said first region at the surface of said substrate;
   a primary field plate electrically connected to said second region at the surface and extending onto an upper surface of said electrically insulating region;
   a first dielectric region on an upper surface of said primary field plate extending opposite said electrically insulating region; and
   a first floating field plate on the upper surface of said electrically insulating region and on an upper surface of said first dielectric region extending opposite said primary field plate.

10. The semiconductor device of claim 9, further comprising a second dielectric region on an upper surface of said first floating field plate extending opposite said electrically insulating region; and a second floating field plate on the upper surface of said electrically insulating region and on an upper surface of said second dielectric region extending opposite said first floating field plate.

11. The semiconductor device of claim 10, wherein a first capacitance between said first floating field plate and said primary field plate is greater than a second capacitance between said second floating field plate and said first floating field plate.

12. The semiconductor device of claim 11, wherein the first capacitance is greater than about two times the second capacitance.

* * * * *